(12) United States Patent
Kuramochi et al.

(10) Patent No.: US 6,252,176 B1
(45) Date of Patent: *Jun. 26, 2001

(54) PRINTED WIRING BOARD, AND MANUFACTURE THEREOF

(75) Inventors: Munehiro Kuramochi; Hiroshi Hagiwara; Kouichi Maeyama, all of Ebina (JP)

(73) Assignee: Fuji Xerox Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/839,253

(22) Filed: Apr. 17, 1997

(30) Foreign Application Priority Data

Apr. 19, 1996 (JP) .................................................. 8-122547

(51) Int. Cl.[7] ........................................................ H05K 3/46
(52) U.S. Cl. .......................... 174/255; 174/262; 174/254; 361/749
(58) Field of Search ..................................... 174/250, 254, 174/255, 262, 117 FF; 361/749, 750, 792, 795, 748; 333/128, 204, 238, 246

(56) References Cited

U.S. PATENT DOCUMENTS

| | | | |
|---|---|---|---|
| 3,680,209 | * | 8/1972 | Hacke .................................. 174/262 |
| 4,161,655 | * | 7/1979 | Cotic et al. ...................... 361/748 X |
| 5,001,604 | * | 3/1991 | Lusby ................................... 361/792 |
| 5,175,047 | * | 12/1992 | McKenney et al. ............. 361/792 X |
| 5,573,632 | * | 11/1996 | Shimizu et al. ................. 427/336 X |
| 5,615,088 | * | 3/1997 | Mizuno ................................ 361/749 |

FOREIGN PATENT DOCUMENTS

| | | |
|---|---|---|
| B2-5-43311 | 7/1993 | (JP) . |
| B2-5-73360 | 10/1993 | (JP) . |
| B2-6-48755 | 6/1994 | (JP) . |
| 6-334339 | 12/1994 | (JP) . |

* cited by examiner

*Primary Examiner*—Hyung-Sub Sough
(74) *Attorney, Agent, or Firm*—Oliff & Berridge, PLC

(57) ABSTRACT

A printed wiring board includes an insulating layer, conductive layers respectively formed into predetermined circuit patterns on the upper and lower surfaces of at least the insulating layer, and a conducting section formed in a portion of the insulating layer so as to enable electrical connection between the upper and lower conductive layers. A thickness of the insulating layer is varied to change the electric characteristics of the printed wiring board according to a circuit configuration of the conductive layers.

12 Claims, 13 Drawing Sheets

PRINTED WIRING BOARD, AND MANUFACTURE THEREOF

BACKGROUND OF THE INVENTION

The present invention relates to a printed wiring board and manufacture thereof and, more particularly, to an improved printed wiring board and an improved manufacturing method thereof in which conductive layers are formed into predetermined circuit patterns on both the upper and lower sides of at least the insulating layer, and a conducting section is formed in a portion of the insulating layer so as to enable electrical connection between the upper and lower conductive layers.

An a result of the debut of digital copiers and color copiers, high-frequency signals are now used. With this situation, countermeasures against EMI (Electromagnetic Interference) according to the VCCI regulations (Voluntary Control Council Interference) pose technically important problem to the business machine industry.

For example, a wiring component used for the transmission of communication and image signals within a digital copier in required to simultaneously satisfy demands for an electromagnetic shielding capability and for the capability of stably transmitting high-frequency signals. In many cases, a shielded electric wire is usually employed an the wiring component. However, the electric wire itself in expensive, and it is difficult to assemble an electric wire for a power source and electric wires for a high-frequency signal into a single wiring component, which in turn prevents reduction in the size of the product.

Printed wiring boards provided with the same noise leak prevention function as that of the shielded electric wire are proposed as means for solving the previously-described problem. For example, a double-sided flexible printed wiring board (hereinafter referred to as a double-sided FPC as required) is formed into a microstrip line structure. One of two sides of the double-sided FPC in used as a signal layer, and the other side is used an a shielding layer (a ground layer). Further, there in proposed a two-layer single-sided flexible printed wiring board (hereinafter referred to an a two-layer single-sided PPC) [the Examined Japanese Patent Application Publication No. Hei 6-48753]. This FPC is produced by forming a signal layer and a shielding layer on respective insulating bases, and by stacking the thus-formed signal layer and the shielding layer into a two-layer structure. The two-layer single-sided flexible printed wiring board is provided with a strip line structure.

The shielding layers of the microstrip line structure and the strip line structure shield the signal layer and suppress the leakage of noise by distorting high-frequency signals to such an extent as to provide no practical problems.

According to a known method of manufacturing the double-sided FPC, an insulating resin base (insulating base), such as polyimide, having both sides coated with metal foil, such as iron, aluminum, or copper, is used. Holes layer are formed in the insulating resin base in order to enable electrical connection between conductor circuits provided on both sides of the insulating resin. The insulating resin base is entirely plated, and conductive circuits (such as a signal layer and a shielding layer) are formed by a known method such as etching.

In contrast, according to another known method of manufacturing the two-layer single-sided FPC, two single-sided metal-foiled plates are formed by coating with iron, aluminum, or copper one side of each of two insulating resin bases (insulating bases) made of polyimide or polyester. Conductor circuits (such an a signal layer and a shielding layer) are formed on the respective FPCs by a known method such as etching. Holes are formed in the desired locations of an insulating resin layer of the respective single-sided metal-foiled plates. Subsequently, the single-sided metal-foiled plates are laminated, and electrical connection between the signal layer and the shielding layer is established by applying conductive paste to the holes.

There often arises the case of handling both a digital signal and an analog signal in one printed wiring board.

However, the required electric characteristics of the printed wiring board change according to whether the printed wiring board handles a digital signal or an analog signal. It is very difficult to handle the signals mixedly.

More specifically, it is necessary to round the waveform of a digital signal to a desired extent while suppressing ringing or reflection. In contrast, it is necessary to faithfully transmit an analog signal without rounding or distorting its waveform and to protect the analog signal from external noise.

At this time, the electric characteristics of the printed wiring board are determined by the thickness and dielectric constant of an insulating layer and by the width and geometry of a wiring pattern. If the electric characteristics are determined according to either the analog or digital signal, the other signal, for example, the analog signal, may be rounded or distorted too much to be practically used. Conversely, in the case of the digital signal, the leakage of noise such an electromagnetic waves increases because of ringing or reflection.

As described above, it in difficult to control the electric characteristics of the printed wiring board so as to satisfy both signals. Particularly, in a case where the frequency of the signal is speeded up, this phenomenon becomes noticeable.

To solve the previously described technical problems, it in conceivable that a printed wiring board for handling a digital signal in independent of a printed wiring board for handling an analog signal, and the electric characteristics of each of the printed wiring boards are controlled so an to match with the corresponding signal. This method adds to the cost of components and therefore is impractical.

Another means for solving the problems in a conductor circuit (a conductor circuit which require small electric capacitance) for handling, e.g., an analog signal, in which only an conductive layer of a shielding layer provided on a circuit pattern possessing small electric capacitance is formed into a mesh or a lattice. As a result, the analog signal becomes more susceptible to external electromagnetic-wave problems, and there arisen another technical problem such as unstable characteristic impedance of the conductor circuit.

SUMMARY OF THE INVENTION

The present invention has boon conceived to solve the previously described technical problems, and the object of the prevent invention is to provide a printed wiring board and a manufacturing method thereof capable of easily controlling the electric characteristics of the wiring board itself so as to match with the characteristics of conductor circuits of a plurality of system while reducing the cost of the printed wiring board.

As illustrated in FIG. 1A, the present invention provides a printed wiring board including an insulating layer 1, conductive layers 2 and 3 (one of them is a signal layer, and the other in a shielding layer) respectively formed into predetermined circuit patterns on the upper and lower surfaces of at least the insulating layer 1, and a conducting section 4 formed in a portion of the insulating layer 1 so as to enable electrical connection between the upper and lower conductive layers 2 and 3, the improvement being characterized by the fact that the thickness of the insulating layer 1 is varied to change the electric characteristics of the printed wiring board according to the circuit configuration of the conductive layers 2 and 3.

In such a technological means, the printed wiring board may be formed into any configuration so long as the conductive layers 2 and 3 are formed on the upper and lower surfaces of the insulating layer 1. If consideration in given to the ease of manufacture of the printed wiring board, as illustrated in FIGS. 1B and 1C, it is desirable for the printed wiring board to comprise a two-layer single-sided printed board 7 [more specifically, 7(1) and 7(2)] in which the conductive layers 2 and 3 are each formed on one side of the respective insulating bases 5 and 6 in predetermined circuit patterns.

So long as electrical conduction between the conductive layers 2 and 3 is established, any type of through-hole such as a via-hole comprising a plated through-hole may be selected as the conducting section 4 of the present invention as required. In a mode in which patterned printed board materials are stacked, it in desirable to fill the via-hole with conductive paste in order to ensure conductivity.

A mode of the printed circuit board, in which its electric characteristics are changed according to the circuit configuration of the conductive layers 2 and 3, is represented by a printed circuit board an illustrated in; e.g., FIG. 1A. In this printed circuit board, a thick portion 1a of the insulating layer 1 correspond to an analog circuit configuration, and a thin portion 1b corresponds to a digital circuit configuration.

Further, although the availability of flexibility (the flexible characteristics) is not required by the printed wiring board of the present invention, it in desirable to provide; e.g., the two-layer single-sided printed wiring board 7 [(more specifically 7(1) and 7(2)], with flexibility if consideration is given to compactness, low profile, and ease of mounting.

One mode of the previously described technical means, in which the thickness of the insulating layer 1 is changed, is represented by a printed circuit board as illustrated in, e.g., FIG. 1B. In this printed circuit board, an auxiliary insulating sheet 8 is interposed in the two-layer single-sided printed board 7. An insulating base 6 (or 5) and the auxiliary insulating sheet 8 interposed between the conductive layers 2 and 3 form the insulating layer 1 having uneven thickness.

The auxiliary insulating shoot 8 may be provided in the area where the thickness of the two-layer single-sided printed board is increased. Alternatively, the auxiliary insulating sheet 8 may be a sheet which has substantially the same size an that of the single-sided printed board 7 and has undesired portions thereof punched.

The dielectric constant of the auxiliary insulating sheet 8 may be selected as required. However, in light of the fine control of the electric characteristics of the printed wiring board, the dielectric constant of the auxiliary insulating sheet 8 should preferably be set to be smaller than that of the insulating base 6 (or 5) interposed between the conductive layers 2 and 3.

Further, although the material of the auxiliary insulating sheet 8 may be selected as require, in light of effective absorption of a stop between a nonlaminated area and a laminated area of the printed wiring board, it in desirable to form at least either the insulating base 6 (or 5) or the auxiliary insulating sheet 8 which forms the insulating layer 1, from a material which in capable of resiliently deforming in a thicknesswise direction; for example, an aromatic-polyamide-based nonwoven fabric impregnated with thermosetting resin.

There are various types of methods of manufacturing a printed wiring board so as to for the insulating layer 1 having an uneven thickness by use of the previously described auxiliary insulating sheet 8. In view of simple manufacture of the printed wiring board having an uneven thickness by utilization of a single-sided printed wiring board, first and second single-sided printed boards 7 [more specifically, 7(1) and 7(2)] are formed in such a way that predetermined circuit patterns 2 and 3 are formed on one side of the respective insulating bases 5 and 6 in the way as illustrated in FIG. 1B. A via-hole 4a for use as the conducting section 4 in formed beforehand in either the first single-sided printed wiring board 7(1) or the second single-sided printed wiring board 7(2). The auxiliary insulating sheet 8 in which the via-hole 4a for use as the conducting section 4 is formed as required, is fixed to either the upper or lower surface of the first single-sided printed wiring board 7(1). Subsequently, the second single-sided printed wiring board 7(2) is fixed to either the upper or lower surface of the first single-sided printed board 7(1) and of the auxiliary insulating sheet 8.

According to the previously described manufacturing method, it in possible to select any process as a process of bonding the single-sided printed board 7(2) to the auxiliary insulating sheet 8 with an inclusion such as an adhesive sandwiched between them, as required. However, in view of the simplification of the bonding step, it is desirable to impregnate at least either the single-sided printed board 7(2) or the auxiliary insulating sheet 8 with thermosetting resin and to utilize the bonding action of the thermosetting resin in a state in which the impregnated resin is in a semi-cured state (or in stage B).

In another made of forming the insulating layer 1 so as to have an uneven thickness, an auxiliary insulating layer 9 such as (thermosetting melamine resin-based, epoxy resin-based, radical polymer-based, or cationic polymer-based) solder resist is printed on a portion between the two-layer single-sided printed board 7. The insulating base 6 (or 5) and the auxiliary insulating layer 9 sandwiched be the conductive layers 2 and 3 form the insulating layer 1 having an uneven thickness.

With regard to this mode, there are mentioned various types of manufacturing methods. In light of simple manufacture of the printed wiring board by utilization of a single-sided printed board, as illustrated in FIG. 1C, first and second single-sided printed boards 7 [more specifically, 7(1) and 7(2)] are formed such that predetermined circuit pattern 2 and 3 are formed on one side of the respective insulating bases 5 and 6. A via-hole 4a for use as the conducting section 4 is formed beforehand in either the first single-sided printed wiring board 7(1) or the second single-sided printed wiring board 7(2). The auxiliary insulating layer 9 in which the via-hole 4a for use as the conducting section 4 in formed as required, is fixed to either the upper or lower surface of the first single-sided printed wiring board 7(1). Subsequently, the second single-sided printed wiring 7(2) is fixed to either the upper or lower surface of the first single-sided printed board 7(1) and the auxiliary insulating layer 9.

According to the previously described manufacturing method, in view of simplification of the step for bonding the single-sided printed board 7(2) to the auxiliary insulating layer 9, it in desirable to impregnate at least either the single-sided printed board 7(2) or the auxiliary insulating layer 9 with thermosetting resin and to utilize the bonding action of the thermosetting resin in a state in which the impregnated resin is in a seat-cured state (or in stage B).

Next, the operation of these technical means will be described.

As illustrated in FIG. 1A, the printed wiring board of the present invention in comprised of the insulating layer 1 and the conductive layers 2 and 3 (one of them in a signal layer, and the other is a shielding layer) respectively formed into predetermined circuit patterns on the upper and lower surfaces of the insulating layer 1. The conductive layers 2 and 3 are electrically connected together through the conducting section 4. According to the circuit configuration of the conductor layers 2 and 3, the thickness of the insulating layer 1 is changed by use of; e.g., the auxiliary insulating sheet 8 or the printed auxiliary insulating layer 9 an illustrated in FIGS. 1B or 1C.

For example, even if the single-sided printed board 7(1), including the insulating base 5 of a given thickness and the conductive layer 2 formed into a predetermined circuit pattern on one side of the insulating bass 5, and the single-sided printed board 7(2), including the insulating base 6 of a given thickness and the conductive layer 3 formed into a predetermined circuit pattern on one side of the insulating base 6, are stacked, the thickness of the insulating layer 1 is set to a desired thickness according to the circuit configuration of the conductive layers 2 and 3, for example, according to whether the conductive layers 2 and 3 form a digital or analog circuit, so long as the thickness of the auxiliary insulating sheet 8 or the auxiliary insulating layer 9 in selected an required. As a result, there in formed a printed wiring board having the electric characteristics corresponding to the circuit configuration of a plurality of systems such as an analog circuit or a digital circuit.

DETAILED DESCRIPTION OF THE PREFERRED EMBODIMENTS

With reference to the accompanying drawings, the present invention will be described in detail hereinbelow in view of its several aspects.

FIRST ASPECT

Figure 1A:
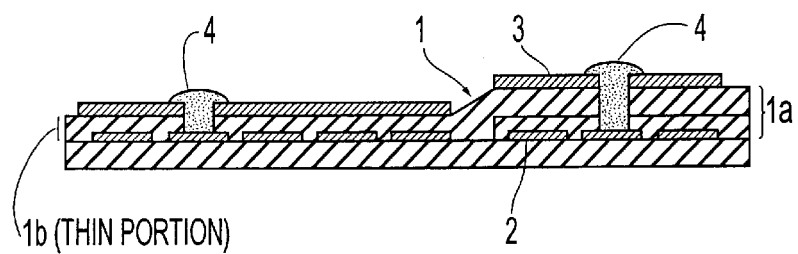
FIG. 1A illustrates the basic configuration of a printed wiring board of the present invention.
Figure 1B:
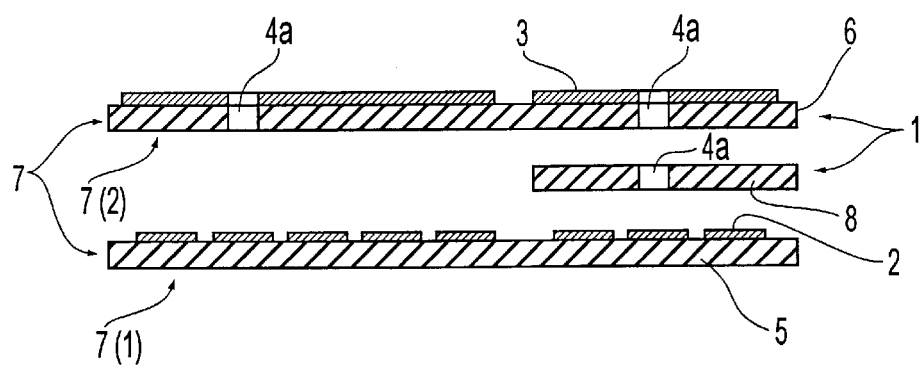
FIGS. 1B and 1C illustrate different methods of manufacturing the printed wiring board of the present invention.
Figure 1C:
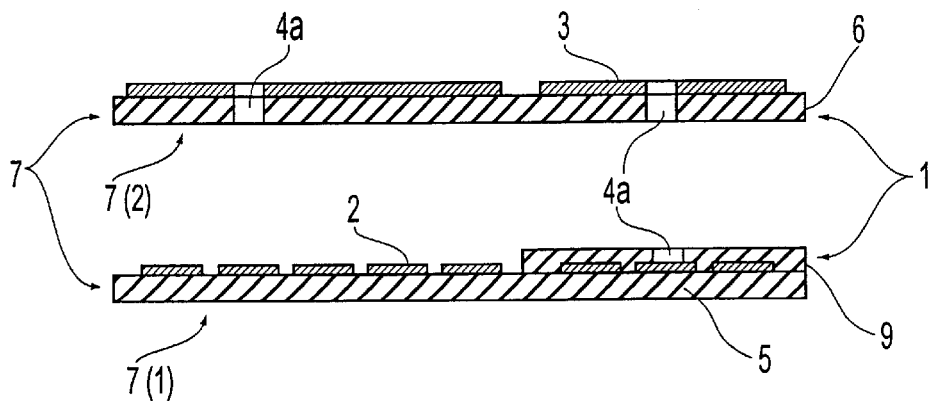
Figure 2:
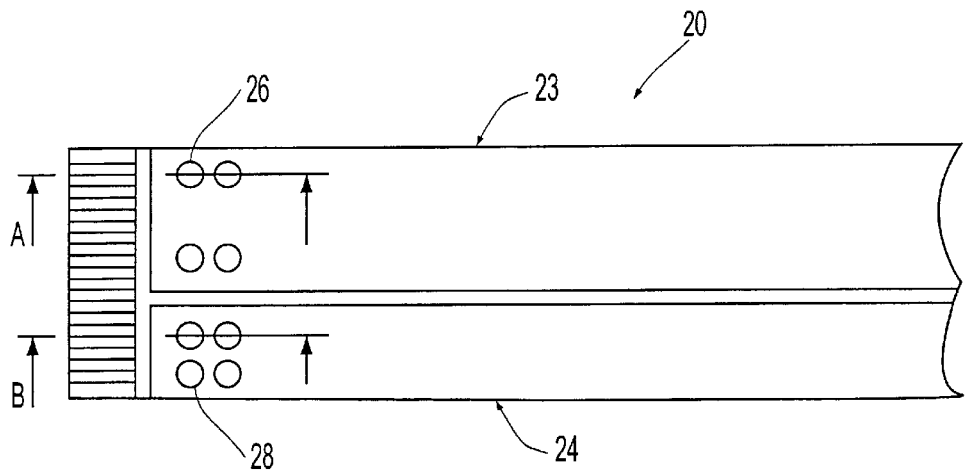
FIG. 2 in a plan view of the printed wiring board of the first embodiment.
Figure 3A:
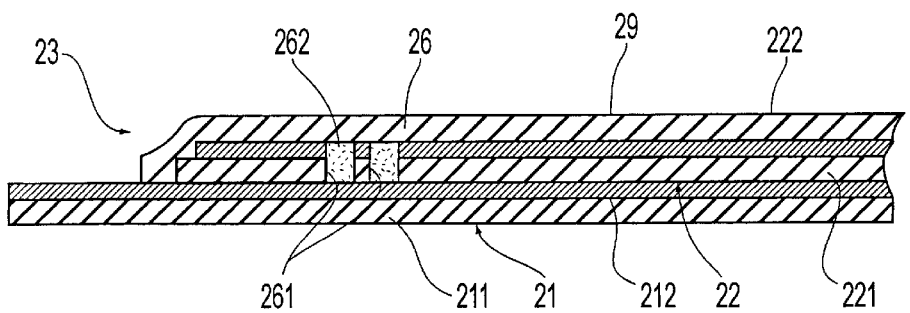
FIG. 3A is a cross-sectional view of the printed wiring board taken across line A—A in FIG. 2.
Figure 3B:
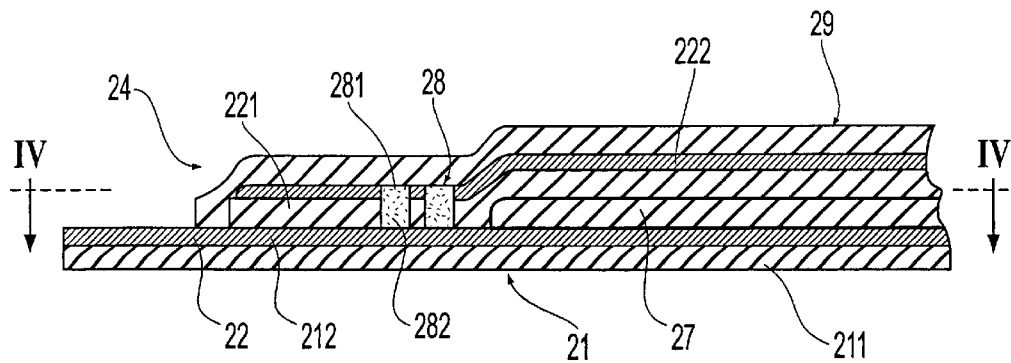
FIG. 3B is a cross-sectional view of the printed wiring board taken across line B—B in FIG. 2.
Figure 4:
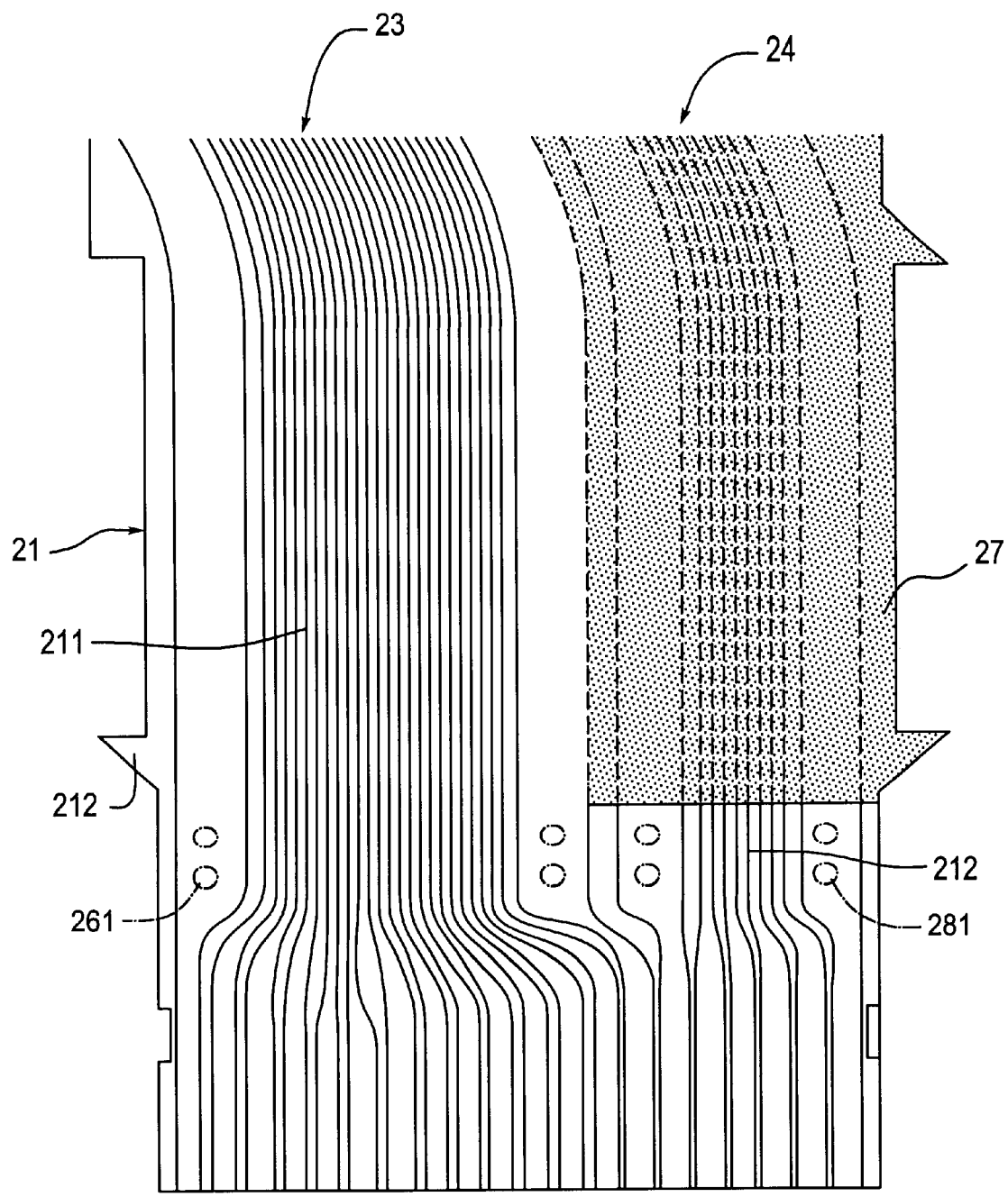
FIG. 4 illustrates the printed wiring board as viewed in the direction designated by IV in FIG. 3B.

FIG. 2 is an explanatory plan view of a printed wiring board according to a first aspect of the present invention. FIG. 3A is a cross-sectional view of the printed wiring board taken across line A—A in FIG. 2, and FIG. 3B is a cross-sectional view of the printed wiring board taken across line B—B in FIG. 2. FIG. 4 is a schematic representation of the printed wiring board as view in the direction designated IV in FIG. 3B.

In the drawings, a printed wiring board 20 has a two-layer structure (including two single-sided FPCs) comprising two flexible single-sided printed boards 21 and 22 stacked on each other. A plurality of circuit systems; e.g., a digital circuit auction 23 and an analog circuit section 24, are mounted on the printed wiring board 20. A surface protecting layer 29 (see FIGS. 3A and 3B) is omitted from FIG. 2.

In the first aspect, as illustrated in FIGS. 3A and 3B, the lower single-sided printed board 21 is comprised of a insulating base 211 having a given thickness, and a conductive layer (corresponding to a signal layer) 212 formed in a predetermined circuit pattern (the digital circuit section 23 and the analog circuit section 24) on one side (the upper surface) of the insulating base 211. The upper single-sided printed board 22 in comprised of an insulating bass 221 having a given thickness, and an conductive layer 222 (corresponding to a shielding layer) provided on one side (the upper surface) of the insulating bass 221 so an to correspond to the overall signal layer 212.

In the first aspect of the present invention, as illustrated in FIG. 3A, the digital circuit auction 23 is comprised of the single-sided printed boards 21 and 22 that are directly stacked on each other, and the signal layer 212 electrically connected to the shielding layer 222 through conducting sections 26.

Reference numeral 29 designates a surface protecting layer which covers the surface of the printed wiring board.

In the first aspect of the present invention, a nonwoven fabric which includes; e.g., aromatic polyamide, as a core material and in impregnated with epoxy and a rubber-based resin is used as the insulating bases 211 and 221 (see the Unexamined Japanese Patent Application Publication No. Hei 6-334339). However, the insulating bases 211 and 221 are not limited to such a material but may be formed from various types of material which start with unsaturated polyester impregnated with a thermosetting resin.

Materials differing from the insulating bases 211 and 221 may be used as an auxiliary shieiding sheet 27. As in the case of the insulating bases 211 and 221, a nonwoven fabric which includes; e.g., aromatic polyamide, as a core material and is impregnated with epoxy and a rubber-based resin, is used as the auxiliary insulating sheet 27 in the first aspect of the invention.

In order to reduce the dielectric constant of the auxiliary insulating sheet 27, a non oven fabric which includes a fluorine-based or polyphenylene-ether-based resin as a core material, may be impregnated with epoxy an a rubber-based resin.

Further, the conducting sections 26 and 28 are formed by forming via-hole 261 and 281 in the insulating bass 221 so as to connect the signal layer 212 with the shielding layer 222, and filling the thus-formed via-holes 261 and 281 with conductive pastes 262 and 282.

Figure 5:
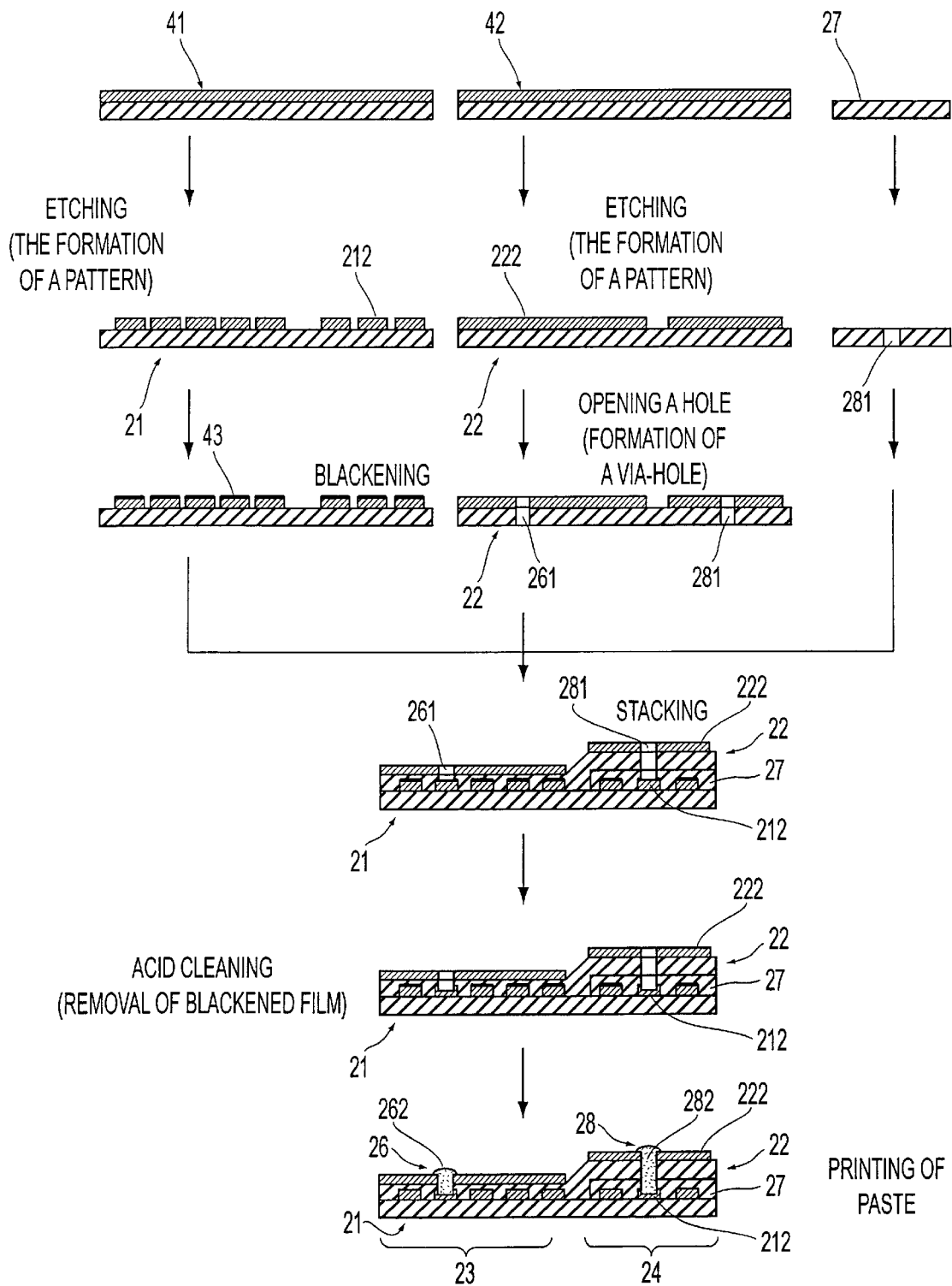
FIG. 5 illustrates a method of manufacturing the printed wiring board of the first embodiment.

Next, a method of manufacturing the printed wiring board in the first aspect of the invention will be described with reference to FIG. 5.

Wiring patterns corresponding to the signal layers 212 and 222 are formed on single-sided metal-foiled platen 41 and 42, each of which is comprised of metal foil (copper foil in the first aspect) laminated on one side of an insulating base, by a known method such as etching, thereby forming the single-sided printed wiring boards 21 and 22. The signal layer 212 (the digital circuit section 23 and the analog circuit section 24) of the first layer single-sided printed board 21 is roughened by blackening (reference numeral 43 designates a blackened film). On the other hand, the via-holes 261 and 281 are formed in the second layer single-sided printed board 22 by pressing or drilling.

Similarly, the via-holes 281 are also formed in the auxiliary insulating sheet 27.

Subsequently, the auxiliary insulating sheet 27 is placed on the area of the first layer single-sided printed board 21 corresponding to the analog circuit 24. The second layer single-sided printed board 22 is stacked on the first layer single-sided printed board 21 by heat pressing. At the time of lamination, the single-sided printed boards 21 and 22 and the auxiliary insulating sheet 27 are relatively positioned by a known method. For example, positioning holes are formed in suitable places of the single-sided printed boards 21 and 22 and the auxiliary insulating sheet 27 which are to be stacked up. The single-sided printed boards 21 and 22 and the auxiliary insulating sheet 27 are stacked on a job having positioning pins provided so as to correspond to the positioning holes. The thus-stacked boards and sheet are temporarily hold and integrally stacked up.

At this time, if the single-sided printed board 22 and the auxiliary insulating sheet 27 are stacked while they are in a semi-cured state (or in stage B), the single-sided printed boards 21 and 22 and the auxiliary insulating sheet 27 are integrally stacked without use of an adhesive.

Further, in the first aspect of the invention, the surface of the signal layer 212; i.e., copper foil, is roughened by blackening. As a result, stable bond strength is obtained in stacking up the single-sided printed boards 21 and 22 and in stacking up the auxiliary insulating sheet 27 and the single sided-printed board 21.

Moreover, in the first aspect of the present invention, a nonwoven fabric is used for the insulating bases 211 and 221 of the single-sided printed boards 21 and 22 (see FIGS. 3A and 3B) and the auxiliary insulating sheet 27. Therefore, it is possible to absorb a step of about 0.1 mm. An a result, the single-sided printed boards 21 and 22 and the auxiliary insulating sheet 27 are stably stacked without causing a problem in the wiring patterns.

The blackened film 43 is formed on the copper foil below the bottoms of the via-holes 261 and 281 of the single-sided printed board 22. Since the blackened film 43 is non-conductive, it does not permit electrical conduction as it is.

For this reason, the blackened film 43 exposed through the surface is removed by acid cleaning using; e.g., hydrochloric acid, in the first aspect of the present invention.

Subsequently, the via-holes 261 and 281 are filled with the conductive pastes 262 and 282 such an a copper or silver paste by use of; e.g., a screen printing machine. Then, the conductive pastes are cured.

Finally, a polyamide film or a solder resist cover (corresponding to the surface protecting layer 29 in FIG. 3) is placed to protect the copper-toiled surface and the pasted surface of the second layer single-sided printed board 22.

According to the printed wiring board in the first aspect of the present invention, the electric characteristics of the printed wiring board respectively matching up with the digital circuit section 23 and the analog circuit section 24 are obtained as is evident from the descriptions of embodiment which will be described later.

SECOND ASPECT

Figure 6:
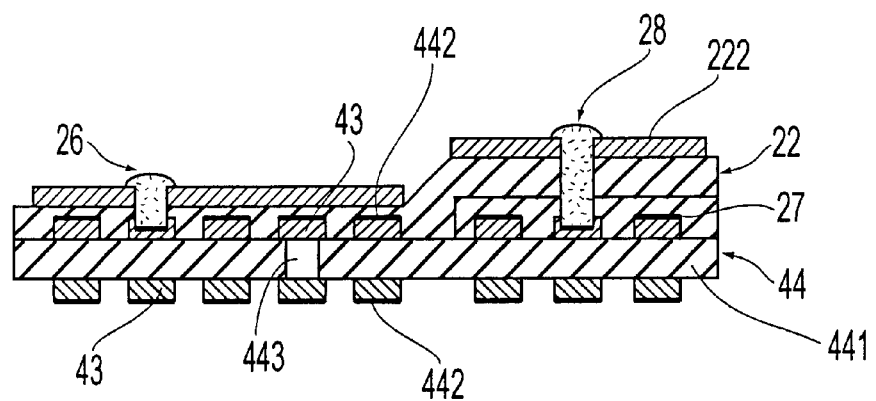
FIG. 6 in a cross-sectional view of a printed wiring board according to a second embodiment.

FIG. 6 illustrates a printed wiring board according to a second aspect of the present invention.

Although the printed wiring board has been manufactured by use of the two single-sided printed boards 21 and 22 in the first aspect of the present invention, a double-sided printed board 44 is used in lieu of the single-sided printed boards as illustrated in FIG. 6 if the wiring pattern of the signal layer 212 exceeds the single-sided printed board 21.

In this case, an insulating base 441 having both its surfaces covered with a metal foil by a known method in used as the double-sided printed board 44. Through-holes 443 are formed in tho areas of the double-sided printed board 44 which are to be opened into via-hole. The overall double-sided printed board 44 is then plated, thereby forming the via-holes from the plated through-holes. In addition, for example, the pattern of a signal layer 442 is formed on the metal foil on both sides of the printed board 44. The blackened film 43 is formed on the surface of the signal layer 442. Protecting covers provided on the upper and lower surfaces of the printed wiring board are omitted from FIG. 6.

THIRD ASPECT

Figure 7:
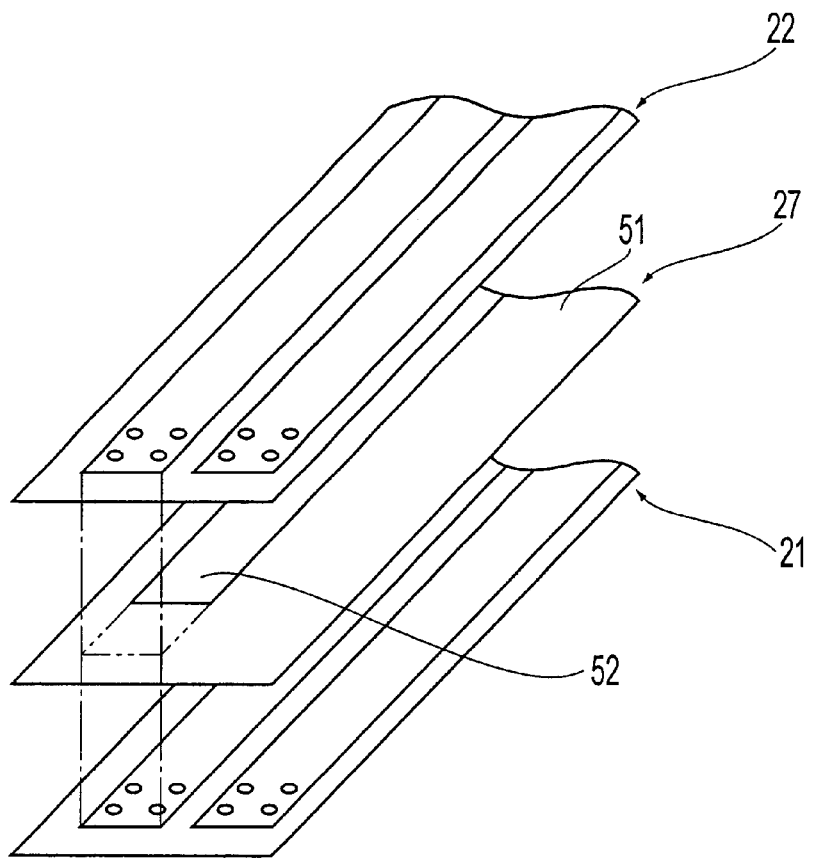
FIG. 7 is a schematic representation of a printed wiring board according to a third embodiment.

FIG. 7 illustrates a printed wiring board according to a third aspect of the present invention.

In the drawing, the basic configuration of the printed wiring board in the third aspect is substantially the same as that of the printed wiring board in the first aspect of the invention. As opposed to the auxiliary insulating sheet in the first aspect of the invention, the auxiliary insulating sheet 27 is not a sheet material having a size corresponding to the required area but an auxiliary insulating sheet 51 which has a size substantially corresponding to the size of the single-sided printed boards 21 and 22 and has unnecessary portions thereof punched into openings 52. The same elements as those of the printed wiring board in the first aspect are assigned the same reference numerals, and their detailed explanations will be omitted here. The same applies to the other aspects of the present invention which will be provided below.

Therefore, according to the third aspect of the invention, it becomes easy to position the auxiliary insulating sheet 27 interposed between the single-sided printed boards 21 and 22 when compared to the first aspect of the invention.

FOURTH ASPECT

The basic configuration of the printed wiring board in a fourth aspect of the invention is substantially the same as that of the printed wiring board in the first aspect of the invention. Instead of the auxiliary insulating sheet 27 an in the first aspect of the invention, the printed wiring board in the fourth aspect employs an auxiliary insulating layer 60 (see FIG. 8) which is formed by printing.

Figure 8:
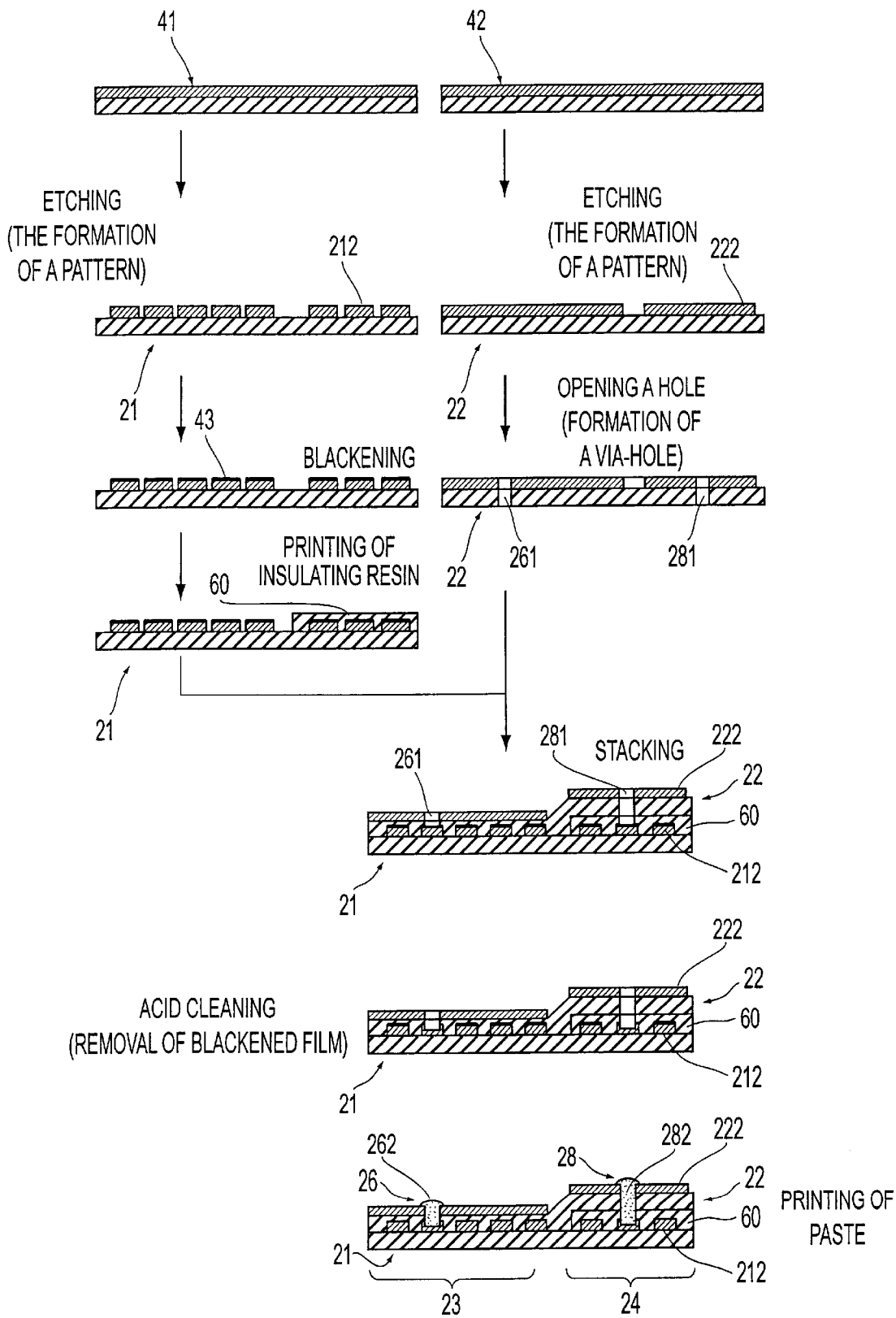
FIG. 8 illustrates a method of manufacturing the printed wiring board of a fourth embodiment.

FIG. 8 illustrates a method of manufacturing the printed wiring board in the fourth aspect of the present invention.

As in the case of the manufacturing method in the first aspect of the present invention, the single-sided printed boards 21 and 22 are formed such that the wiring patterns of the signal layer 212 and the shielding layer 222 are formed on one surface of each of the printed boards. The single-sided printed boards 21 and 22 are blackened, and holes are formed in the single-sided printed boards 21 and 22.

An insulating resin layer 60 composed of; e.g., thermo-setting solder resist (thermosetting melamine resin-based, epoxy resin-based, radical polymer-based, or cationic polymer-based solder resist) is printed on the area of the first layer single-sided printed board 21 corresponding to the analog circuit section 24. At this time, the insulating resin layer 60 in formed into a printed pattern from which the via-holes 281 have been removed.

Subsequently, the second layer single-sided printed board 22 is stacked on the first layer single-sided printed board 21 having the insulating resin layer 60 printed thereon.

If the single-sided printed board 22 in stacked on the single-sided printed board 21 while it is in a semi-cured state (or in stage B) at this time, the single-sided printed boards 21 and 22 are integrally stacked up without use of an adhesive as they are in the first aspect of the invention.

As in the case of the first aspect of the invention, the blackened film 43 formed on the copper foil below the bottom of the via-holes formed in the single-sided printed board 22 is removed by acid. Subsequently, the via-holes 261 and 281 are filled with the conductive pastes 262 and 282 such as a copper or silver paste by use of; e.g., a screen printing machine. Then, the conductive pastes are cured.

Finally, a polyamide film or a solder resist cover (not shown) is placed to protect the copper-foiled surface and the pasted surface of the second layer single-sided printed board 22.

Even in the case of the printed wiring board in the fourth aspect of the invention, the electric characteristics of the printed wiring board respectively matching up with the digital circuit section 23 and the analog circuit section 24 are obtained as they are in the first aspect of the invention.

FIFTH ASPECT

As opposed to the printed wiring boards in the first through fourth aspects of the present invention, a printed wiring board in a fifth aspect of the invention is formed by sequentially stacking required layers on one single-sided metal-foiled plate, and by finally forming wiring patterns in the metal foil (e.g., copper foil) formed on the upper and lower surfaces of the insulating layer having different thicknesses by use of a known method such an etching.

Figure 9:
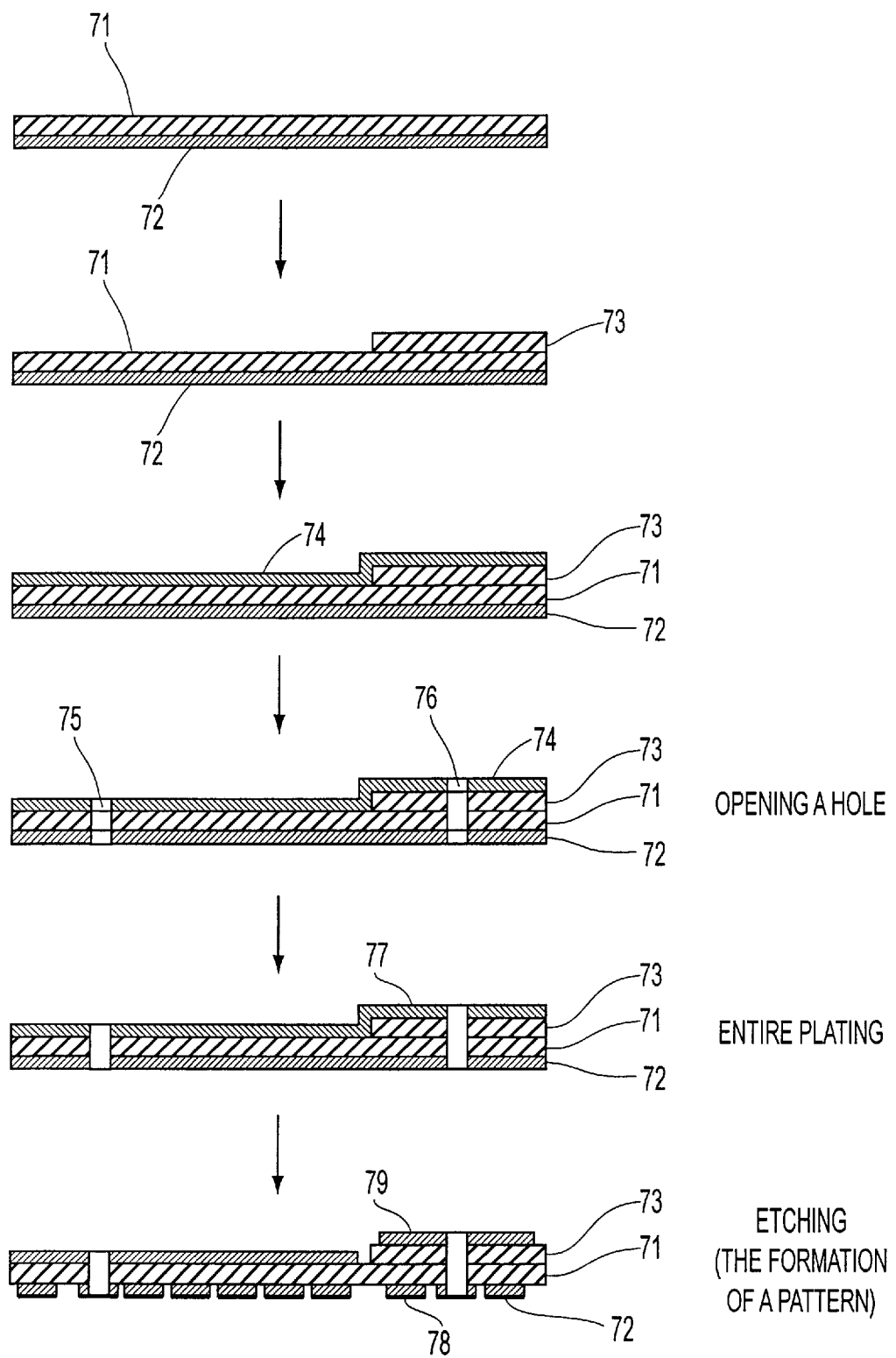
FIG. 9 illustrates a method of manufacturing the printed wiring board of a fifth embodiment.

FIG. 9 shows a method of manufacturing a printed wiring board according to the fifth aspect of the present invention.

First, an auxiliary insulating sheet 73 is stacked on a non-metal-foiled side (or the upper surface) of a single-sided metal-foiled plate 71 which is comprised of an insulating base having a given thickness and metal foil 72 stacked on one side (or the lower surface) of the insulating base. Then, metal foil (e.g., copper foil) 74 in additionally stacked on the upper surfaces of the single-sided metal-foiled plate 71 and the auxiliary insulating sheet 73.

After via-holes 75 and 76 have been formed in the single-sided metal-foiled plate 71, the surface of the metal foil 72 and 74 and the via-holes 75 and 78 is entirely coated with plating 77 by means of electroless or electrolytic plating. Wiring patterns corresponding to a signal layer 78 and a shielding layer 79 are formed in the metal foil 72 and 74 by a known method such as etching.

Even in the thus-manufactured printed wiring board, the same electric characteristics as those of the printed wiring board in the first aspect are obtained.

In the fifth aspect of the present invention, an auxiliary insulating layer similar to that in the fourth aspect may be used in lieu of tho auxiliary insulating sheet 73.

SIXTH ASPECT

In contrast to the printed wiring boards according to the first through fourth aspects of the invention, a printed wiring board in a sixth aspect of the invention is formed by forming wiring patterns on one single-sided metal-foiled plate by a known method such as etching, and by sequentially stacking the required layers on the single-sided metal-foiled plate.

Figure 10:
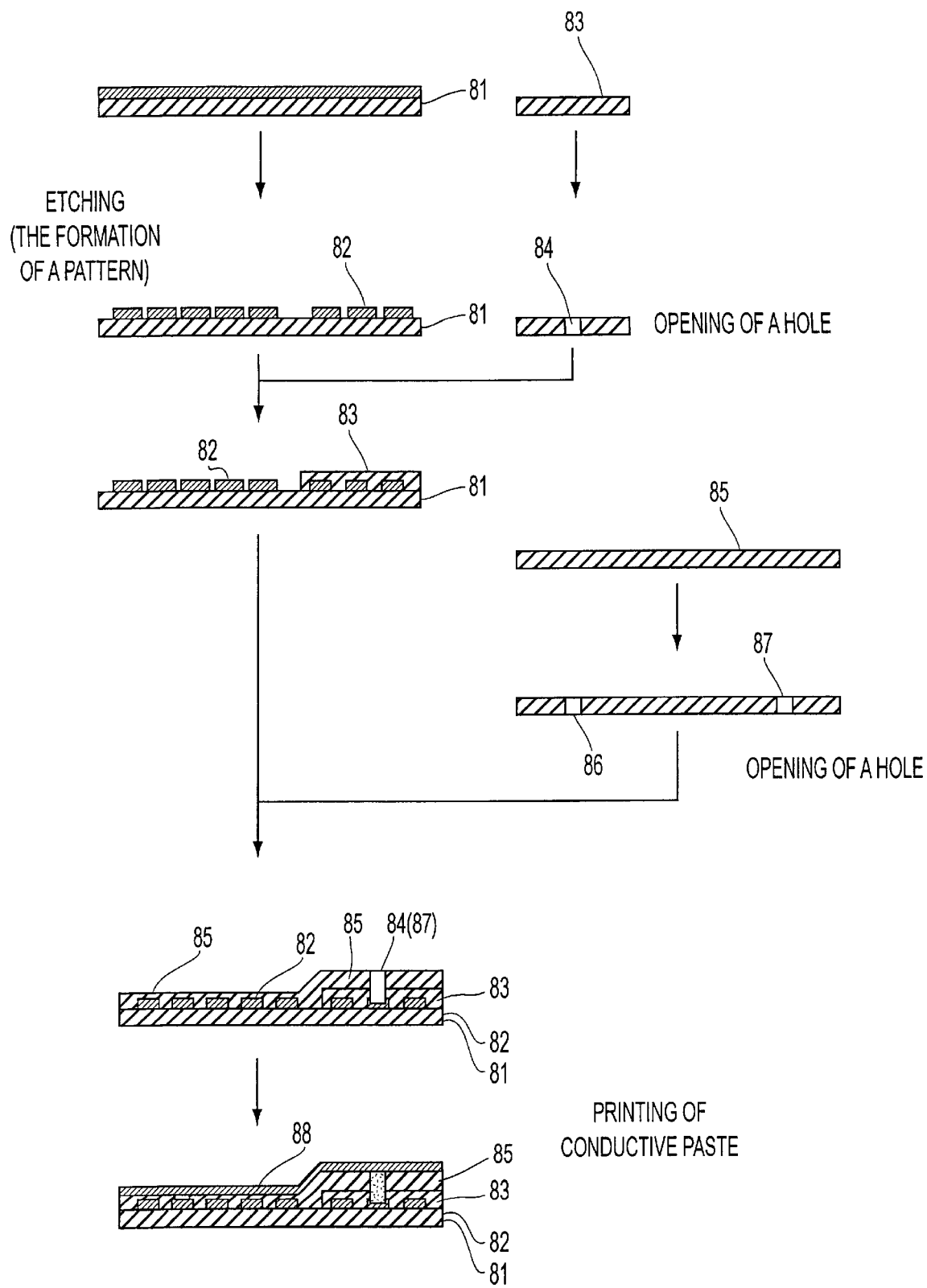
FIG. 10 illustrates a method of manufacturing the printed wiring board of a sixth embodiment.

FIG. 10 illustrates a method of manufacturing the printed wiring board in the sixth aspect of the present invention.

First, a wiring pattern corresponding to a signal layer 82 (e.g., a digital circuit section and an analog circuit section) is formed on a single-sided metal-foiled plate 81, which is comprised of an insulating bass having a predetermined thickness and metal foil (copper foil in the sixth aspect of the invention) stacked on one surface of the insulating base, by means of a known method such as etching. Then, an auxiliary insulating sheet 83 is additionally stacked on the area of the wiring pattern corresponding to the analog circuit section. Via-holes 84 have previously been formed in the auxiliary insulating sheet 83.

Next, after via-holes 86 and 87 have been formed in an insulating base 85 plate having a given thickness, the insulating base plate 85 is stacked so as to cover the wiring pattern of the single-sided metal-foiled plate 81 and the auxiliary insulating sheet 83. The upper surface of the insulating base plate 85 and the via-holes 84, 86, and 87 are coated with conductive paste by screen printing, thereby forming a shielding layer 88.

Finally, for example, a polyimide film or a solder resist cover (not shown) is provided to cover the surface of the conductive paste.

Even in the case of the printed wiring board in the sixth aspect of the invention, the same electric characteristics as those of the printed wiring board in the first aspect are obtained.

SEVENTH ASPECT

As in the case of the printed wiring boards in the first through fourth aspects of the invention, a printed wiring board in a seventh aspect of the invention is made up of two single-sided metal-foiled plates. In contrast to the printed wiring boards in the first through fourth aspects of the invention, the printed wiring board in the seventh aspect is formed by finally forming a wiring pattern on metal foil (e.g., copper foil) formed on the upper and lower surfaces of the insulating layer having different thicknesses by means of a known method such as etching.

Figure 11:
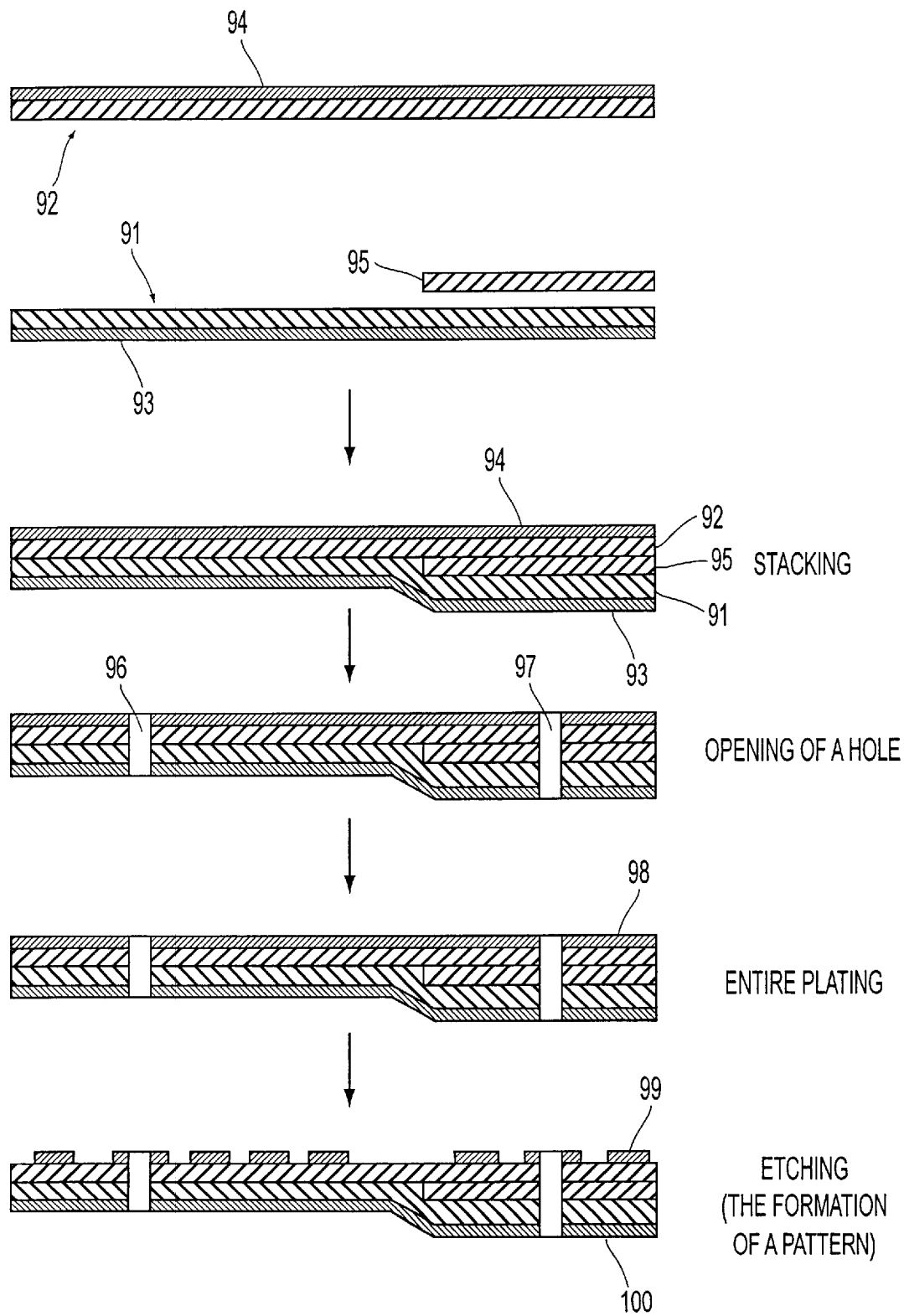
FIG. 11 illustrates a method of manufacturing the printed wiring board of a seventh embodiment.

FIG. 11 illustrates a method of manufacturing the printed wiring board in the seventh aspect of the invention.

First, two single-sided metal-foiled plates 91 and 92, each of which is comprised of an insulating bass having a given thickness and metal foil stacked on one side of the insulating base, are positioned so as to be opposite to each other with their metal-foiled sides outside. An auxiliary insulating sheet 95 is interposed between the unfoiled sides of the two single-sided metal-foiled plates 91 and 92 in the area corresponding to; e.g., an analog circuit. Then, the two single-sided metal-failed plates 91 and 92 are stacked up.

After via-holes 96 and 97 have been formed in the single-sided metal-foiled plates 91 and 92, the surface of the metal foil 93 and 94 and the via-holes 96 and 97 are entirely coated with plating 98 by means of electroless or electrolytic plating. Wiring patterns corresponding to a signal layer 99 and a shielding layer 100 are formed in the metal foil 93 and 94 by a known method such as etching.

Even in the case of the printed wiring board in the seventh aspect of the invention, the same electric characteristics as those of the printed wiring board as in the first aspect are obtained.

In the seventh aspect of the present invention, an auxiliary insulating layer similar to that in the fourth aspect may be used in lieu of the auxiliary insulating sheet 95.

FIRST EMBODIMENT

In a first embodiment, a printed wiring board as in the first aspect of the present invention.

Copper foil is laminated on an insulating sheet (corresponding to the insulating base of the lower single-sided printed board) which has a thickness of about 100 $\mu$m and is comprised of a nonwoven aromatic polyamide fabric impregnated with epoxy and a rubber-based resin. For example, conductor circuit patterns for a signal layer are formed in the insulating sheet by a subtractive process.

Subsequently, a blackened film is formed on the surface of the conductor circuit patterns.

An insulating sheet (corresponding to the auxiliary insulating sheet) which has a thickness of about 100 $\mu$m and is comprised of a nonwoven aromatic polyamide fabric impregnated with epoxy and a rubber-based resin, is selectively thermocompression-bonded particularly to a circuit pattern (i.e., an analog circuit pattern) which requires small electric capacitance of the thus-formed circuit patterns, while holes for interlayer connection purposes are formed in the insulating sheet as required.

An insulating sheet having the following structure is further laid on the previously-described insulating sheet by thermocompression bonding. Specifically, the insulating sheet (corresponding to the insulating base of the upper single-sided printed board) is formed into a thickness of about 100 $\mu$m from a nonwoven aromatic polyamide fabric impregnated with epoxy and a rubber-based resin and is in a semi-cure state. Copper foil is laminated on this insulating sheet, and conductor circuit patterns for a shielding layer are formed on the insulating sheet by a subtractive process. Holes for interlayer connection purposes are further formed in the insulating sheet.

Thermocompression bonding of the insulating sheets is carried out under conditions; namely, a pressure of 30 to 50 Kg/cm$^2$ and a temperature of 140 to 160° C.

The blackened film formed below the bottom of the via-holes formed for interlayer connection purposes is removed by acid. The via-holes are then filled with a polymer-type copper paste E-1000 (trade name) manufactured by Mitsui Metal Coating Chemicals Co., Ltd. After the polymer type copper paste has been thermally set, a polyimide cover is provided to protect the copper foil wiring pattern on the topmost layer of the multilayered printed wiring board by thermocompression bonding.

SECOND EMBODIMENT

A second embodiment shows an illustrative example of the printed wiring board in the second aspect of the present invention.

Holes are formed in a glass epoxy plate having both surfaces thereof foiled with copper in order to ensure electrical connection between the copper layers. The overall glass epoxy plate is plated.

For example, conductor circuit patterns for a signal layer are formed on both surfaces of the thus-plated glass epoxy plate by a subtractive process, and a blackened film is formed on the surface of the conductor circuit patterns.

Further, in a desired location of the conductor circuit pattern at least one of the surfaces of the conductor is placed an insulating sheet (Corresponding to an auxiliary insulating sheet) which has a thickness of about 100 $\mu$m, is comprised of a nonwoven aromatic polyamide fabric impregnated with epoxy and a rubber-based resin, and is in a semi-cured state.

An insulating sheet having the following structure is further laid on the previously-described insulating sheet by thermocompression bonding. Specifically, the insulating sheet (corresponding to an auxiliary insulating sheet) is formed into a thickness of about 100 $\mu$m from a nonwoven aromatic polyamide fabric impregnated with epoxy and a rubber-based resin and is in a semi-cured state. Copper foil is laminated on this insulating sheet, and conductor circuit patterns for a shielding layer are formed on the insulating sheet by a subtractive process. Holes for interlayer connection purposes are further formed in the insulating sheet.

Thermocompression bonding of the insulating sheets is carried out under conditions; namely, a pressure of 30 to 50 Kg/cm$^2$ and a temperature of 140 to 160° C.

The blackened film formed below the bottom of the via-holes formed for interlayer connection purposes is removed by acid. The via-holes are then filled with a polymer-type copper paste E-1000 (trade name) manufactured by Mitsui Metal Coating Chemicals Co., Ltd. As a result, the interlayer connection is accomplished by combination of the plated through-holes and the copper paste.

Finally, a polyimide cover and resist ink are laid on and applied to the upper surface of the laminated substrate in order to protect the exposed copper foil surface.

Measurement of Electric Characteristics of the First (or Second) Embodiment

Measurement Method

With regard to the first embodiment (the insulating layer of the digital circuit section has a thickness of 100 $\mu$m, and the insulating layer of the analog circuit section has a thickness of 200 µm) and a comparative example (the insulating layers of the digital and analog circuit sections have a thickness of 100 µm), the electric characteristics of the analog circuit section is measured by use of an HP4194A impedance analyzer, and the frequency characteristics of a transmission circuit is measured by use of an EP4185A network analyzer). Further, the waveform of a transmitted signal is measured by use of an oscilloscope.

Measurement Result

Electrical Characteristics

Table 1 provides the results of the measurements of the electrical characteristics of the printed wiring boards.

TABLE 1

| ITEM | EMBODIMENT t = 200 µm | COMPARATIVE EXAMPLE t = 100 µm | RATE OF INCREASE OR DECREASE |
|---|---|---|---|
| ELECTRIC CAPACITANCE (pF) | 66 | 100 | −34% |
| INDUCTANCE (nH) | 179 | 139 | +29% |
| CHARACTERISTIC IMPEDANCE (Ω) | 51 | 37 | +38% |
| RESONANCE FREQUENCY (MHz) | 46 | 42 | +9% |

Figure 14A:
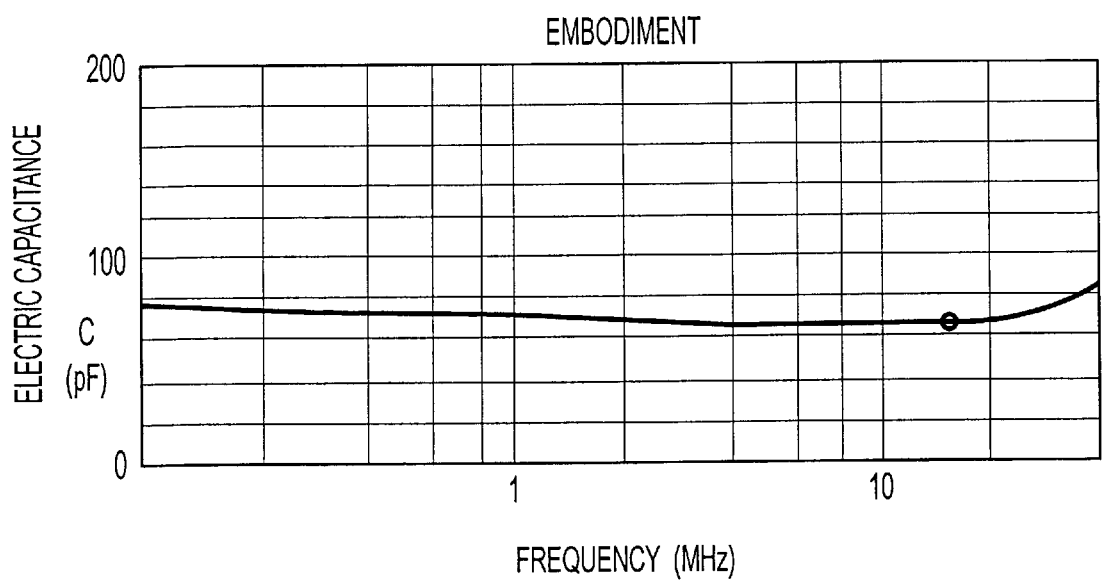
FIG. 14A is a plot illustrating the electric capacitance characteristics of the printed wiring board of the embodiment.
Figure 14B:
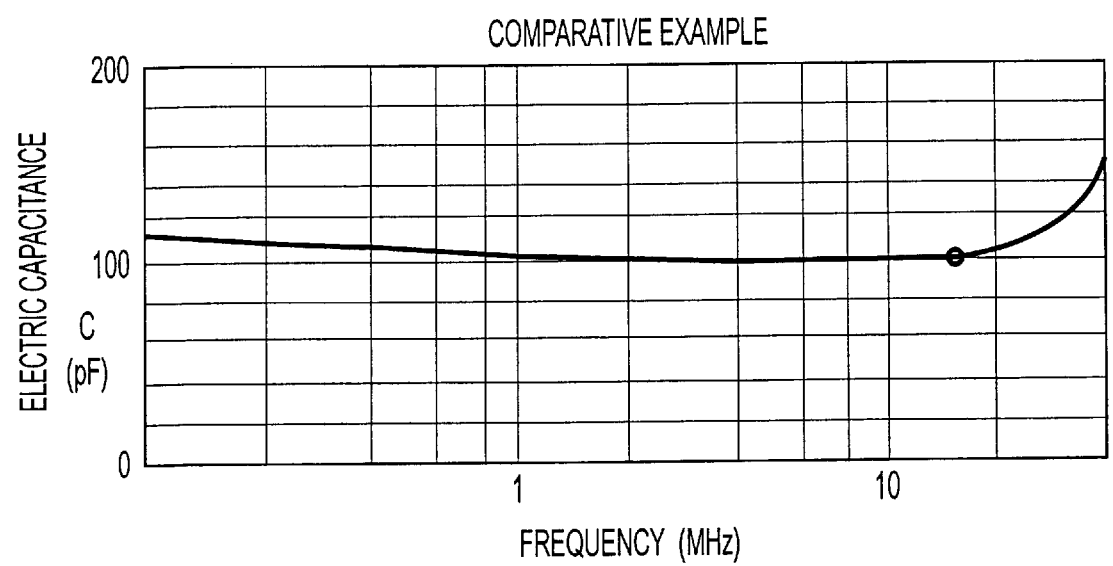
FIG. 14B is a plot illustrating the electric capacitance characteristics of the printed wiring board of the comparative example.

As illustrated in FIGS. 14A and 14B, it is understood that the electric capacitance is reduced by about 35% as a result of a change in the thickness of the insulating layer from 100 micrometers to 200 micrometers. Since the electric capacitance is expressed by Equation (1) given below, the electric capacitance should be ideally reduced to half its original capacitance if the thickness of the insulating layer is doubled. However, a measurement value is slightly greater than the expected value.

$$C = \epsilon S/d \qquad (1)$$

(where $\epsilon$ is a dielectric constant, S is an area, and "d" is a thickness)

Figure 15A:
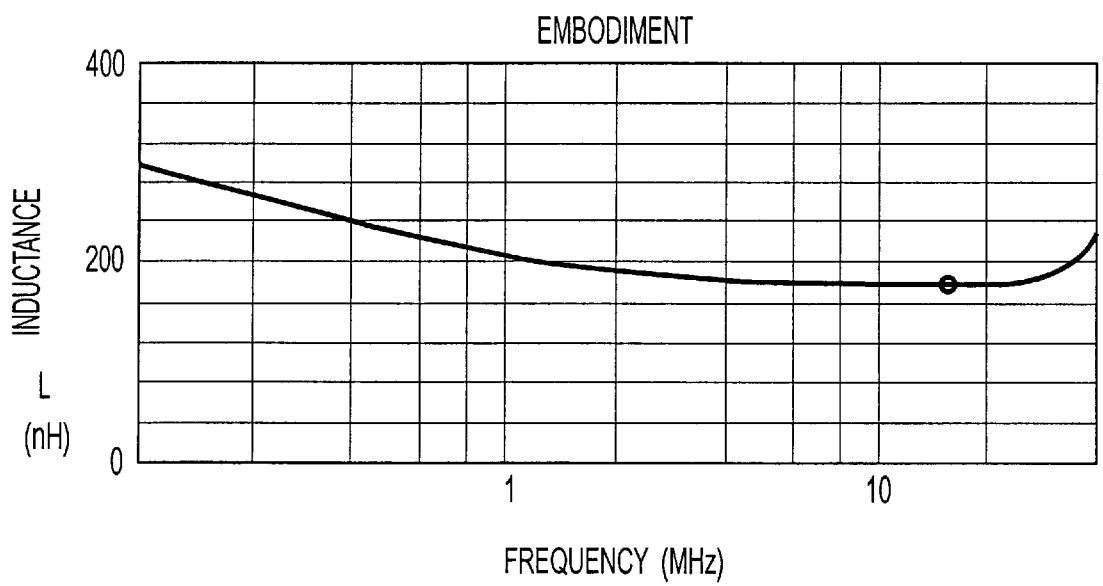
FIG. 15A is a plot illustrating the inductance characteristics of the printed wiring board of the embodiment.
Figure 15B:
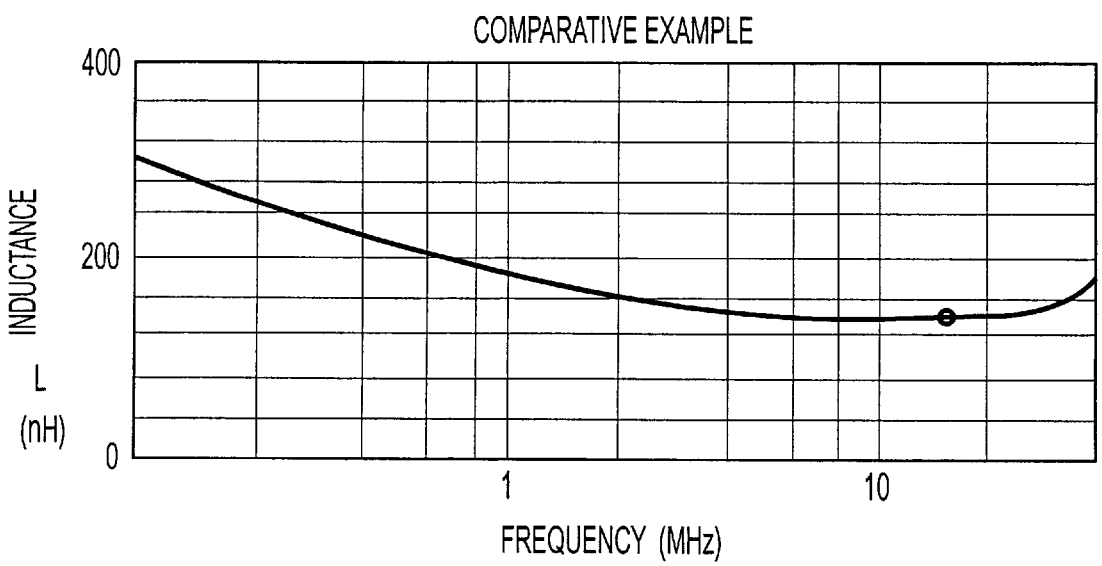
FIG. 15B is a plot illustrating the inductance characteristics of the printed wiring board of the comparative example.

In contrast, as illustrated in FIG. 15, the inductance of the printed wiring board is increased by about 30% as a result of doubling of the thickness of the insulating layer.

An has been described above, since the rate of reduction of the electric capacitance in greater than that of the inductance, both the characteristic impedance ($Z0 = \sqrt{L/C}$) and a resonance frequency ($fR = \frac{1}{2\pi\sqrt{LC}}$) of the printed wiring board itself increase. Therefore, the characteristics of the printed wiring board become optimum for transmission of a high-frequency signal. It could have confirmed that the electric characteristics of the printed wiring board were sufficiently controlled by controlling the thickness of the printed wiring board.

Frequency Characteristics of a Transmission Circuit

Figure 16A:
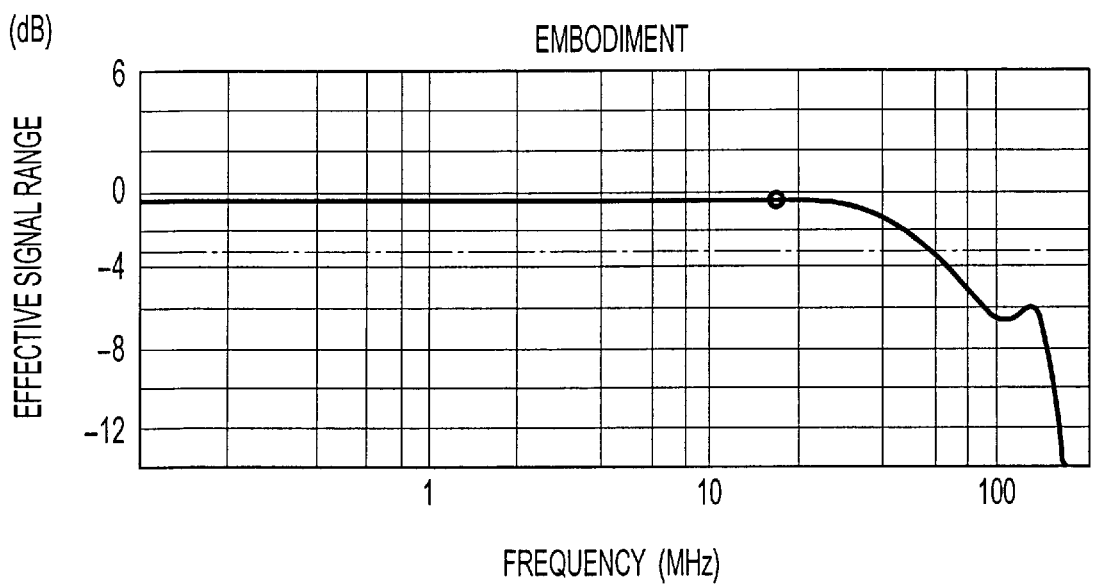
FIG. 16A in a plot illustrating the frequency characteristics of the embodiment.
Figure 16B:
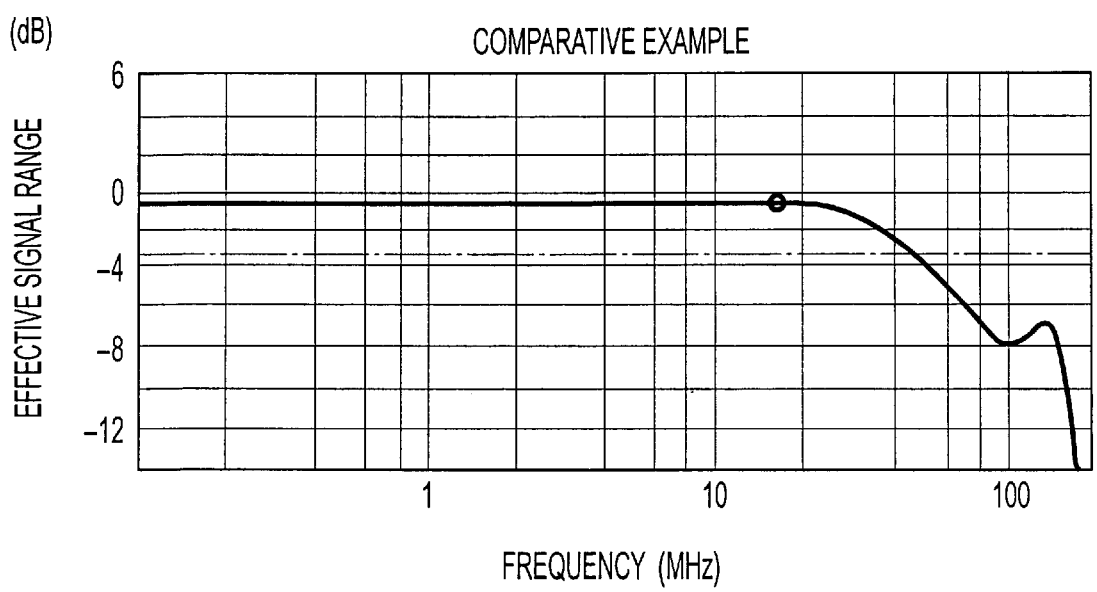
FIG. 16B in a plot illustrating the frequency characteristics of the comparative example.

The frequency characteristics of transmission circuits of the embodiment and comparative example are measured by use of attenuation coefficients of the transmission circuits as parameters. The attenuation coefficients $\zeta$ are set to the range of 0.5 to 1.0, and the damping resistance of an element to be inserted into the circuit is set to become as close to the resistance calculated from the characteristic impedance and preset attenuation constants $\zeta$ of the comparative example as possible. An illustrated in FIG. 16, the frequency characteristics used herein designate a frequency attenuated from a gain peak value by −3 dB.

Figure 12:
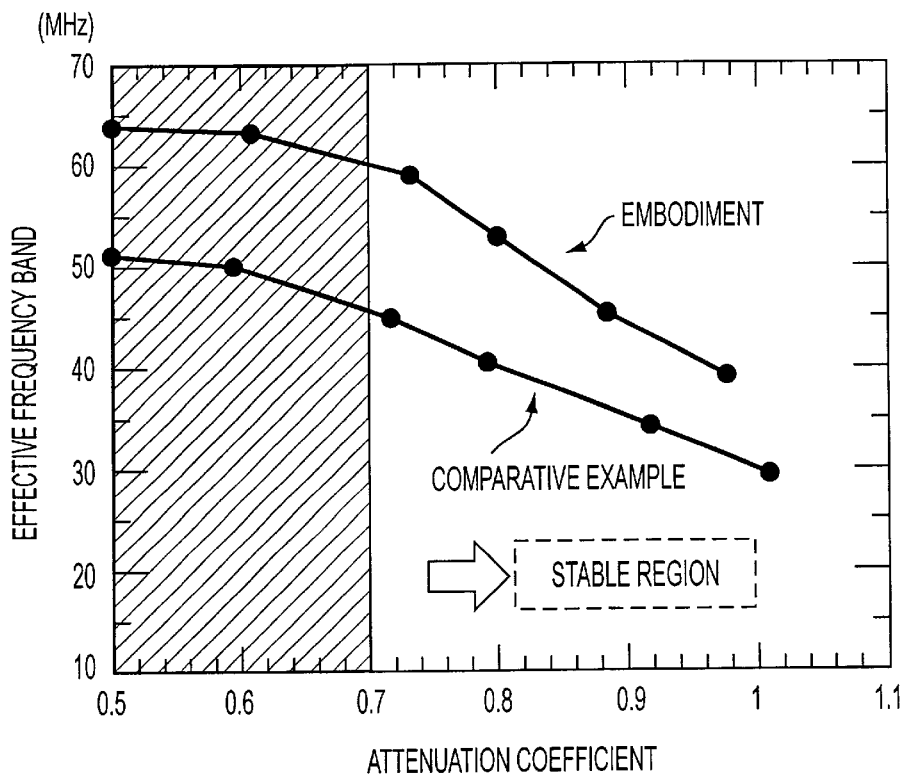
FIG. 12 in a plot illustrating the relationship between attenuation coefficients and effective frequency bands with regard to the embodiment and a comparative example.
Figure 13:
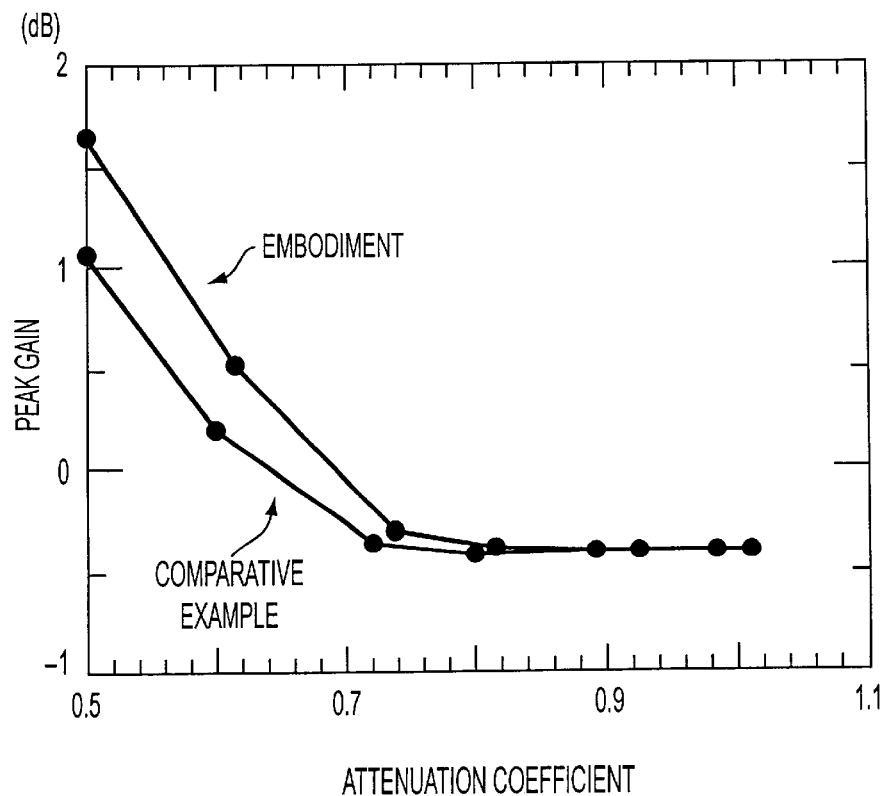
FIG. 13 is a plot illustrating the relationship between attenuation coefficients and peak gains with regard to the embodiment and the comparative example.

The results of the measurements are illustrated in FIGS. 12 and 13.

FIG. 12 is a plot illustrating the attenuation coefficients $\zeta$ vs. the frequency characteristics, and FIG. 13 is a plot illustrating the attenuation coefficients $\zeta$ vs. the gain peak values.

It is necessary for an analog signal transmission circuit to have sufficiently flat frequency characteristics with respect to the frequency components of a transmission signal. It is seen that, when compared with the comparative example, the band frequency of the transmission circuit of the embodiment in which the capacity components of the circuit are reduced, is extended with respect to all the attenuation coefficients by about 10 MHz.

To make the frequency characteristics of the transmission path flat, it is necessary to set the attenuation coefficient to a value more than 0.707 ($=1/\sqrt{2}$). If the attenuation coefficient has decreased to become smaller than 0.7 as illustrated in FIG. 13, a peak arises in the frequency characteristics, thereby resulting in possibility of the development of ringing. In FIG. 13, the slight increase in the gain peak value of the embodiment compared to that of the comparative example is considered to be attributable to the difference between the resistance of the printed wiring board itself and the damping resistance set without consideration of the resistance of the printed wiring board.

Ideally, the gain peak value Gp can be calculated from the attenuation coefficients.

$$Gp = 1/\{2\zeta \times \sqrt{(1-\zeta^2)}\}$$

where $\zeta \leq 1/\sqrt{2}$.

The frequency band in the vicinity of the attenuation coefficient $\zeta = 0.7$ is about 60 MHz in the embodiment and about 46 MHz in the comparative example.

If an analog signal such as an output of a charge-coupled device (CCD) is transmitted, a band which is three times as wide as a drive frequency of the CCD becomes necessary. In contrast to transmission of a signal of 15 MHz in the comparative example, a signal of about 20 MHz can be transmitted in the embodiment.

As describes above, it becomes possible to transmit a signal at a high speed by use of a printed wiring board having a partial increase in its thickness.

Waveform of Transmitted Signal

Next, the waveform of the analog signal (having a drive frequency of $f\phi = 12.5$ MHz) is measured while it is transmitted from the CCD through the previously-described transmission circuit. The attenuation coefficient of the transmission circuit is set to one. The frequency band of the transmission circuit when the attenuation coefficient is set to one, is about 40 MHz in the embodiment and is about 30 MHz in the comparative example.

Although the CCD output signal has an analog waveform analogous to a rectangular waveform, transient response becomes important as the characteristics of the transmission circuit. There is a relationship between a response time T of the waveform and the frequency band fT of the transmission circuit; namely, T = 0.35/fT. Theoretically, it is possible to expect an improvement of about 3 ns in the response time in the embodiment and the comparative example.

As a result of comparison between the waveforms of the transmitted CCD output signals of the embodiment and the comparative example according to the result of the measurement, it could have confirmed an increase in response to trailing of the waveform of the embodiment; namely, an improvement of the response time about 4 ns.

In view of the previous descriptions, it is understood that the reduction in the electric capacity of the printed wiring board due to an increase in the thickness of the printed wiring board has sufficiently contributed to an improvement in the transient response.

The similar test was performed with regard to the second embodiment, and substantially the same result as that of the first embodiment was obtained.

An has been described above, even in a case where circuit sections which require different electric characteristics with respect to the printed wiring board mixedly exist; for example, in a case where an analog circuit section and a digital circuit section are mounted one printed wiring board, the present invention allows matching of the electric characteristics of one printed wiring board to the respective requirements by controlling the thickness of the insulating layer interposed between two conductive layers for each circuit.

As a result, it becomes unnecessary to provide a printed wiring board for each circuit configuration, which in turn enables cost reduction and easy control of the electric characteristics of the printed wiring board itself according to the characteristics of each of a plurality of systems of conductor circuits.

Further, if the printed wiring board is formed by stacking two single-sided printed wiring boards, each of which is comprised of an insulating base and a conductive layer formed on one side of the insulating base in a given circuit pattern, the present invention allows easy manufacture of a printed wiring board having an uneven thickness by interposing an insulating layer formation member (e.g., an auxiliary insulating sheet or an auxiliary insulating layer) for increasing the thickness of the layer between the single-sided printed boards.

Further, if the single-sided printed board is provided with flexibility, the present invention makes it possible to readily provide a compact and thin printed wiring board which is easy to mount.

In the aspect of the present invention in which an auxiliary insulating sheet is sandwiched between the single-sided printed boards, if a sheet having unnecessary portions thereof punched is used as the auxiliary insulating sheet, it is possible to very easily position the auxiliary insulating sheet with respect to the single-sided printed board.

If an auxiliary insulating sheet whose dielectric constant in smaller than that of the insulating base of the single-sided printed board is used, it is possible to finely control the electric characteristics of the printed wiring board by adjusting the thickness of the auxiliary insulating sheet.

If at least either the auxiliary insulating sheet or the single-sided printed board is formed from material elastically deformable in a thicknesswise direction, the single-sided printed board absorbs a stop resulting from lamination of the auxiliary insulating sheet in order to control the thickness of the printed wiring board. Consequently, the laminated state of the single-sided printed board or the auxiliary insulating sheet can become more stable.

If either the auxiliary insulating sheet or the auxiliary insulating layer is impregnated with thermosetting resin when either of them in fixed to the single-sided printed board, and if the auxiliary insulating layer or sheet is stacked on the single-sided printed board while it is in a semi-cured state (in stage B), the impregnated resin performs the function of an adhesive. The member to be stacked burrows into the surface on which the member will be stacked, as a result of which high bond strength is obtained. This makes it possible to reliably stack the members without use of an adhesive by simple thermocompression bonding.

What is claimed is:

1. A printed wiring board containing a first of circuit configuration type and a second circuit configuration type, the printed wiring board comprising:
    a first insulating base member having a first conductive layer formed on one side thereof, the first conductive layer formed into a predetermined circuit pattern including a first circuit portion of the first circuit configuration type and a second circuit portion of the second circuit configuration type,
    an auxiliary insulating member partially formed on the first conductive layer of the first insulating base member at a position corresponding to the second circuit portion,
    a second insulating base member formed on the first insulating base member, the second insulating base member having a second conductive layer on one side thereof, the second conductive layer being formed into a predetermined circuit pattern, the auxiliary insulating member being interposed between the second insulating base member and the first insulating base member, and
    a conductive member that electrically connects the first conductive layer and the second conductive layer, the conductive member passing through an insulating layer that is formed by the second insulating base member and the auxiliary insulating member between the first conductive layer and the second conductive layer,
    wherein the insulating layer comprises:
        a thin insulating portion of a thickness determined by a thickness of the second insulating base member, the thin insulating portion corresponding positionally to the first circuit portion, and
        a thick insulating portion, thicker than the thin insulating portion, having a thickness determined by a thickness of the second insulating base member and a thickness of the auxiliary insulating member, the thick insulating portion corresponding positionally to the second circuit portion.

2. The printed wiring board according to claim 1, wherein the thickness of the thin insulating portion and the thickness of the thick insulating portion are different from each other, such that:
    a specific impedance between the first circuit portion of the circuit pattern of the first conductive layer and the circuit pattern of the second conductive layer, and
    a specific impedance between the second portion of the circuit pattern of the first conductive layer and the circuit pattern of the second conductive layer are different from each other.

3. The printed wiring board according to claim 1, further comprising:
    a third conductive layer, the third conductive layer being formed into a predetermined circuit pattern on another side of the first insulating base member.

4. The printed wiring board according to claim 1, wherein the first circuit configuration type is a digital circuit, and the second circuit configuration type is an analog circuit.

5. The printed wiring board according to claim 1, wherein the insulating layer is flexible.

6. The printed wiring board according to claim 1, wherein the auxiliary insulating member is a printed insulating auxiliary member.

7. The printed wiring board according to claim 1, wherein the conductive member passes through the thick portion of the insulating layer.

8. The printed wiring board according to claim 1, wherein the auxiliary insulating member is an auxiliary insulating sheet.

9. The printed wiring board according to claim 8, wherein the auxiliary insulating sheet is a sheet wherein at least one unnecessary portion is punched out.

10. The printed wiring board according to claim 8, wherein the auxiliary insulating sheet has a dielectric ratio of a value lower than that of the second insulating base member.

11. The printed wiring board according to claim 8, wherein at least one of the second insulating base member and the auxiliary insulating sheet that form the insulating layer is made from a material that is flexible along a thickness direction of the material.

12. The printed wiring board according to claim 8, wherein at least one of the second insulating base member and the auxiliary insulating member that form the insulating layer is made of non-woven cloth containing aromatic polyamide into which thermosetting resin is impregnated.

* * * * *